United States Patent
Jeong et al.

(10) Patent No.: US 12,471,459 B2
(45) Date of Patent: Nov. 11, 2025

(54) DISPLAY DEVICE WITH THERMAL CONTROL STRUCTURES INCLUDING PRINTED LAYER

(71) Applicant: Samsung Display Co., Ltd., Yongin-si (KR)

(72) Inventors: Wee-Joon Jeong, Seongnam-si (KR); Yongil Kim, Suwon-si (KR); Byoungkyoo Park, Yongin-si (KR); Jangun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 620 days.

(21) Appl. No.: 17/834,520

(22) Filed: Jun. 7, 2022

(65) Prior Publication Data
US 2023/0061651 A1 Mar. 2, 2023

(30) Foreign Application Priority Data
Aug. 30, 2021 (KR) .................. 10-2021-0114613

(51) Int. Cl.
*H10K 59/131* (2023.01)
*H10K 50/87* (2023.01)
*H10K 59/38* (2023.01)

(52) U.S. Cl.
CPC ........... *H10K 59/131* (2023.02); *H10K 50/87* (2023.02); *H10K 59/38* (2023.02)

(58) Field of Classification Search
CPC ....... H10K 50/87; H10K 59/38; H10K 59/131
See application file for complete search history.

(56) References Cited

U.S. PATENT DOCUMENTS

| 4,803,380 | A | 2/1989 | Jacoby, Jr. | |
| 11,054,871 | B2 | 7/2021 | Cho et al. | |
| 11,209,875 | B2 | 12/2021 | Jang | |
| 2013/0162506 | A1 | 6/2013 | Kim et al. | |
| 2017/0277235 | A1* | 9/2017 | Delano | H05K 7/20427 |
| 2019/0364695 | A1* | 11/2019 | Lee | H05K 7/20336 |
| 2020/0053919 | A1* | 2/2020 | Lee | H05K 9/009 |

(Continued)

FOREIGN PATENT DOCUMENTS

| JP | 6462730 | 1/2019 |
| KR | 10-2010-0070816 | 6/2010 |

(Continued)

OTHER PUBLICATIONS

Bauer, Joanna, et al., "Thermal Effects of Mobile Phones on Human Auricle Region", Journal of Thermal Biology, vol. 79, pp. 56-68 (Year: 2019).*

(Continued)

*Primary Examiner* — Fernando L Toledo
*Assistant Examiner* — Ryan T. Fortin

(57) ABSTRACT

A display device includes a display panel, a bottom chassis under the display panel, and a circuit board electrically connected to the display panel and disposed under the bottom chassis. The circuit board includes a circuit base layer, at least one circuit element disposed on a lower surface of the circuit base layer, and a printed layer disposed on an upper surface of the circuit base layer and having an emissivity of about 0.3 or less. The bottom chassis includes an opening overlapping the at least one circuit element in a plan view.

18 Claims, 12 Drawing Sheets

(56) References Cited

U.S. PATENT DOCUMENTS

| | | | | |
|---|---|---|---|---|
| 2020/0209674 A1* | 7/2020 | Won | ........................ | H04R 3/12 |
| 2020/0233469 A1* | 7/2020 | Won | ...................... | G06F 1/1626 |
| 2021/0013455 A1* | 1/2021 | Bae | ...................... | H10K 59/122 |
| 2022/0109124 A1* | 4/2022 | Kang | ................. | H10K 59/8794 |

FOREIGN PATENT DOCUMENTS

| | | |
|---|---|---|
| KR | 10-2016-0009914 | 1/2016 |
| KR | 10-2020-0114823 | 10/2020 |
| KR | 10-2021-0009716 | 1/2021 |
| KR | 10-2021-0014244 | 2/2021 |
| KR | 10-2021-0018700 | 2/2021 |

OTHER PUBLICATIONS

International Search Report corresponding to International Application No./Patent No. PCT/KR2022/012898 dated Dec. 1, 2022.

* cited by examiner

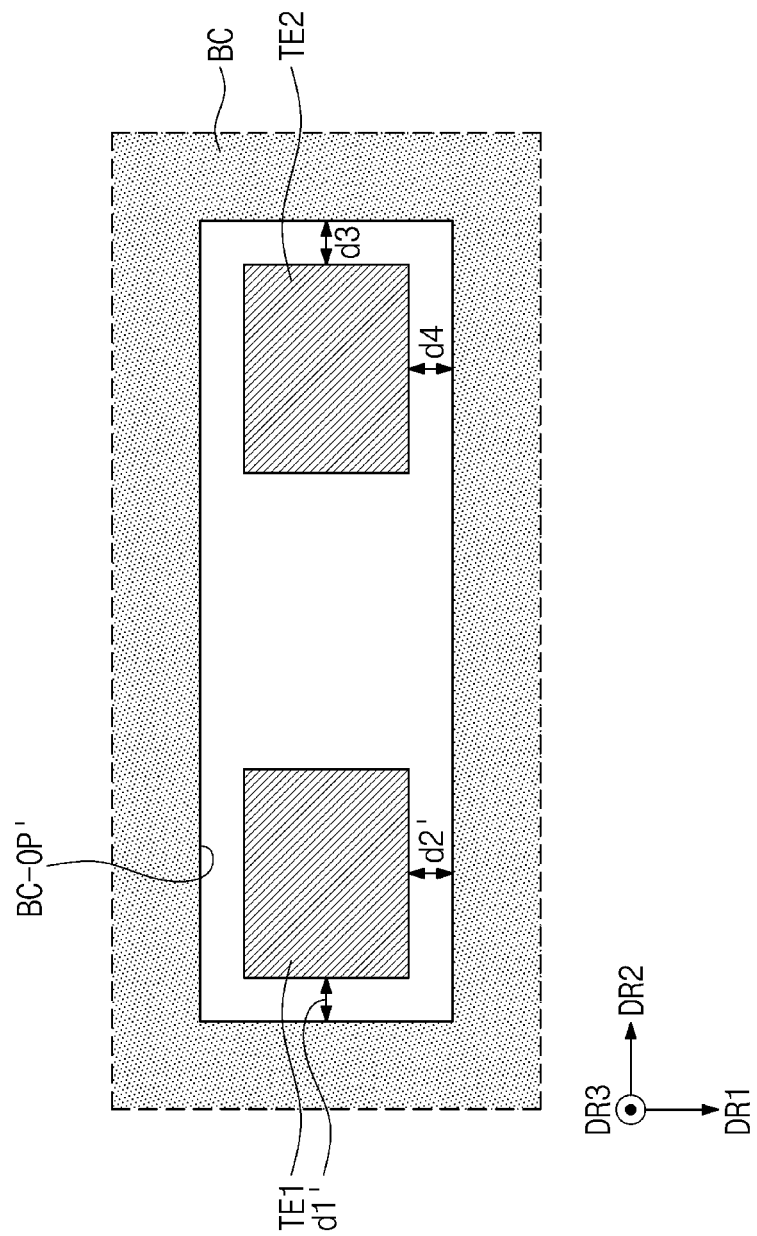

DISPLAY DEVICE WITH THERMAL CONTROL STRUCTURES INCLUDING PRINTED LAYER

CROSS-REFERENCE TO RELATED APPLICATION(S)

This U.S. non-provisional patent application claims priority to and benefits of Korean Patent Application No. 10-2021-0114613 under 35 U.S.C. § 119, filed on Aug. 30, 2021 in the Korean Intellectual Property Office (KIPO), the entire contents of which are incorporated herein by reference.

BACKGROUND

The disclosure herein relates to a display device, and more specifically, to a display device with improved display efficiency and lifespan.

A display panel included in a display device may be divided into a transmissive display panel that selectively transmits a source light generated from a light source and a light emitting display panel that generates a source light from the display panel itself. The display panel may include different types of light control patterns depending on the pixels to generate a color image. The light control pattern may transmit only a partial wavelength range of the source light or may change the color of the source light. Some of the light control patterns may change light characteristics without changing the color of the source light.

In general, after the display panel is manufactured, a circuit board is electrically connected to the display panel. For example, in the Tape Automated Bonding (TAB) mounting method, the circuit board is bonded to the display panel by using an anisotropic conductive film (ACF).

Recently, design proposals for a display device to effectively dissipate heat generated from the display panel or circuit board included in the display device while the thickness of the display device is reduced are being actively studied.

SUMMARY

The disclosure provides a display device capable of preventing thermal damage to a display panel while reducing the overall thickness of the display device.

An embodiment of the disclosure provides a display device including a display panel; a bottom chassis under the display panel; and a circuit board electrically connected to the display panel and disposed under the bottom chassis. The circuit board includes a circuit base layer; at least one circuit element disposed on a lower surface of the circuit base layer; and a printed layer disposed on an upper surface of the circuit base layer and having an emissivity of about 0.3 or less. The bottom chassis includes an opening overlapping the at least one circuit element in a plan view.

In an embodiment, an area of the opening may be greater than an area of the at least one circuit element in a plan view, and the at least one circuit element entirely may overlap the opening in a plan view.

In an embodiment, a distance between an end of the bottom chassis defining the opening and an end of the at least one circuit element may be about 5 mm or more and about 20 mm or less.

In an embodiment, a width in a first direction of the opening may be greater than a width in the first direction of the at least one circuit element, and wherein a width of the opening in a second direction intersecting the first direction may be greater than a width in the second direction of the at least one circuit element.

In an embodiment, the printed layer may have a white color.

In an embodiment, an area of the opening with respect to an area of the circuit base layer may be about 0.8 or more and less than about 1 in a plan view.

In an embodiment, the display device may further include an insulating layer disposed under the bottom chassis and having an emissivity of about 0.3 or less.

In an embodiment, at least a portion of the insulating layer may be disposed in the opening.

In an embodiment, the at least one circuit element may include a first sub-circuit element and a second sub-circuit element spaced apart from the first sub-circuit element. The opening may overlap each of the first sub-circuit element and the second sub-circuit element in a plan view.

In an embodiment, the opening may include a first opening overlapping the first sub-circuit element in a plan view; and a second opening overlapping the second sub-circuit element and spaced apart from the first opening in a plan view.

In an embodiment, the display device may further include a connection circuit board electrically connecting the display panel and the circuit board, wherein the connection circuit board is bent with a curvature.

In an embodiment, the display device may further include a housing accommodating the display panel and the circuit board; and a window disposed on the display panel.

In an embodiment, the display panel may include a light emitting element that outputs a source light; a light control layer disposed on the light emitting element and including light control patterns; and a color filter layer disposed on the light control layer and including color filters.

In an embodiment, the bottom chassis and the circuit board may be spaced apart by an interval, and the interval may be about 0.5 mm or more and about 1 mm or less.

In an embodiment, the display device may further include a heat dissipation layer disposed between the display panel and the bottom chassis.

In an embodiment of the disclosure, a display device includes a display module including a display panel and a bottom chassis; a circuit board electrically connected to the display panel and including a circuit base layer, at least one circuit element disposed on a lower surface of the circuit base layer, and a printed layer disposed on an upper surface of the circuit base layer and having an emissivity of about 0.3 or less; and a radiation blocking layer disposed between the display module and the circuit base layer and having an emissivity of about 0.3 or less. The circuit base layer includes a circuit portion on which at least one circuit element is disposed; and a peripheral portion that does not overlap the at least one circuit element in a plan view. A distance from an upper surface of the circuit portion to a lower surface of the display module is greater than a distance from an upper surface of at least a portion of the peripheral portion to the lower surface of the display module.

In an embodiment, an opening overlapping the at least one circuit element in a plan view may be defined in the bottom chassis. An area of the opening may be greater than an area of the circuit element in a plan view.

In an embodiment of the disclosure, a display device includes a display panel; a heat dissipation layer under the display panel; a bottom chassis disposed under the heat dissipation layer and including an opening exposing a lower surface of the heat dissipation layer; and a circuit board electrically connected to the display panel and disposed under the bottom chassis. The circuit board includes a circuit base layer; at least one circuit element disposed on a lower surface of the circuit base layer; and a printed layer disposed on an upper surface of the circuit base layer and having an emissivity of about 0.3 or less.

In an embodiment, the display device may further include an insulating layer disposed between the heat dissipation layer and the circuit board and having an emissivity of about 0.3 or less.

In an embodiment, the printed layer may have a white color.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIG. 6B is a plan view schematically illustrating a partial configuration of a display device according to an embodiment of the disclosure;

DETAILED DESCRIPTION OF THE EMBODIMENTS

Figure 1:
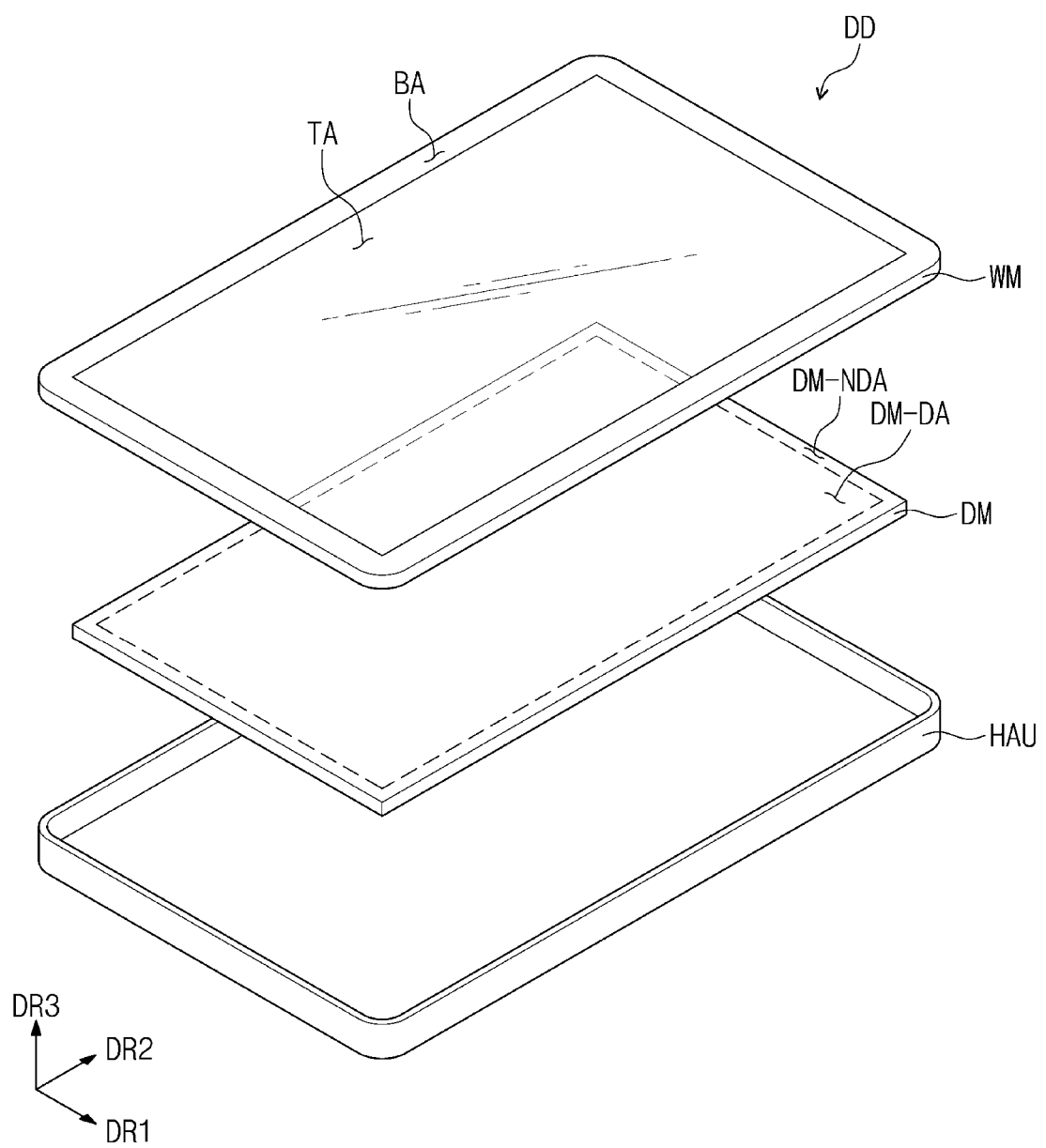
FIG. 1 is an exploded perspective view of a display device according to an embodiment of the disclosure.

Hereinafter, embodiments of the disclosure will be described with reference to the drawings.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components may be exaggerated for effective description. The term "and/or" includes all of one or more combinations defined by related components.

It will be understood that the terms "first," "second," and the like are used herein to describe various components but these components should not be limited by these terms. The above terms are used only to distinguish one component from another. For example, a first component may be referred to as a second component and vice versa without departing from the scope of the disclosure. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing.

In various embodiments of the disclosure, the term "include," "comprise," "including," or "comprising," specifies a property, a region, a fixed number, a step, a process, an element and/or a component but does not exclude other properties, regions, fixed numbers, steps, processes, elements and/or components.

Meanwhile, in the specification, "directly disposed" may mean that there is no layer, film, region, plate, and the like added between a portion such as a layer, film, region, or plate and another portion. For example, "directly disposed" may mean disposing between two layers or two members without using an additional member such as an adhesive member.

The phrase "at least one of" is intended to include the meaning of "at least one selected from the group of" for the purpose of its meaning and interpretation. For example, "at least one of A and B" may be understood to mean "A, B, or A and B."

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which this disclosure pertains. In addition, terms such as terms defined in commonly used dictionaries should be interpreted as having a meaning consistent with the meaning in the context of the related technology, and it should not be construed in an overly ideal or overly formal sense unless explicitly defined here.

Hereinafter, a display panel and a method of manufacturing the same according to an embodiment of the disclosure will be described with reference to the drawings.

FIG. 1 is a schematic exploded perspective view of a display device according to an embodiment of the disclosure.

In an embodiment, a display device DD may be a large display device such as a television, a monitor, or an external billboard. Also, the display device DD may be a display device used for small and medium-sized products such as personal computers (PC), laptop computers, personal digital terminals, car navigation systems, game consoles, smartphones, tablet PC, and cameras. In addition, these are presented only as examples, and other display devices may be employed without departing from the concept of the disclosure.

The display device DD according to an embodiment may include a window WM, a display module DM, and a housing HAU. The display module DM may include a display panel DP (see FIG. 3) that is a display element. Although not shown in the drawings, the display device DD may include various elements activated according to an electrical signal, such as a touch element or a detection element, in addition to the display element.

FIG. 1 and the following drawings illustrate the first direction DR1 to the third direction DR3, but the directions indicated by the first to third directions DR1, DR2, and DR3 described herein are relative concepts and may be changed to other directions.

In this specification, for convenience of description, the third direction DR3 is defined as a direction in which an image is provided to a user. Also, the first direction DR1 and the second direction DR2 may be orthogonal to each other, and the third direction DR3 may be a direction normal to a plane defined by the first direction DR1 and the second direction DR2. As illustrated in FIG. 1, a plane defined by the first direction DR1 and the second direction DR2 may be a display surface on which an image is provided.

In this specification, for convenience of description, the thickness direction of the display device DD is indicated by the third direction DR3. The front surface (or upper surface) and the rear surface (or lower surface) of each of the layers or units described below are divided by the third direction DR3. In the specification, the directions indicated by the first to third directions DR1, DR2, and DR3 may mean all directions parallel to each of the directions unless otherwise stated.

Although omitted in FIG. 1, a circuit board MPCB (see FIG. 2A), which will be described below, is electrically connected to the display module DM. A detailed description of the display module DM and the circuit board MPCB will be described below.

In the display device DD according to an embodiment, the window WM may be disposed on the display module DM. The window WM may be made of a material including glass, sapphire, or plastic. The window WM includes a transmissive area TA through which an image provided from the display module DM is transmitted and a light blocking area BA which is adjacent to the transmissive area TA and through which the image is not transmitted. Unlike shown in FIG. 1, the window WM in the display device DD according to an embodiment may be omitted.

In the display device DD according to an embodiment, the display module DM may be disposed under the window WM. The display module DM may include a display panel DP (see FIG. 3) and an optical structure layer OSL (see FIG. 3), which will be described below.

On a plane (or in a plan view), a surface of the display module DM on which an image is displayed is defined as a display surface. The display surface includes a display area DM-DA in which an image is displayed and a non-display area DM-NDA in which an image is not displayed. The display area DM-DA may be defined in the center of the display module DM in a plan view and overlap the transmissive area TA of the window WM.

The housing HAU may be disposed under the display module DM to accommodate the display module DM. The housing HAU may be disposed to cover the display panel DP so that an upper surface that is a display surface of the display panel DP is exposed. The housing HAU may cover the side and bottom surfaces of the display panel DP and expose the entire upper surface of the display panel DP.

Figure 2A:
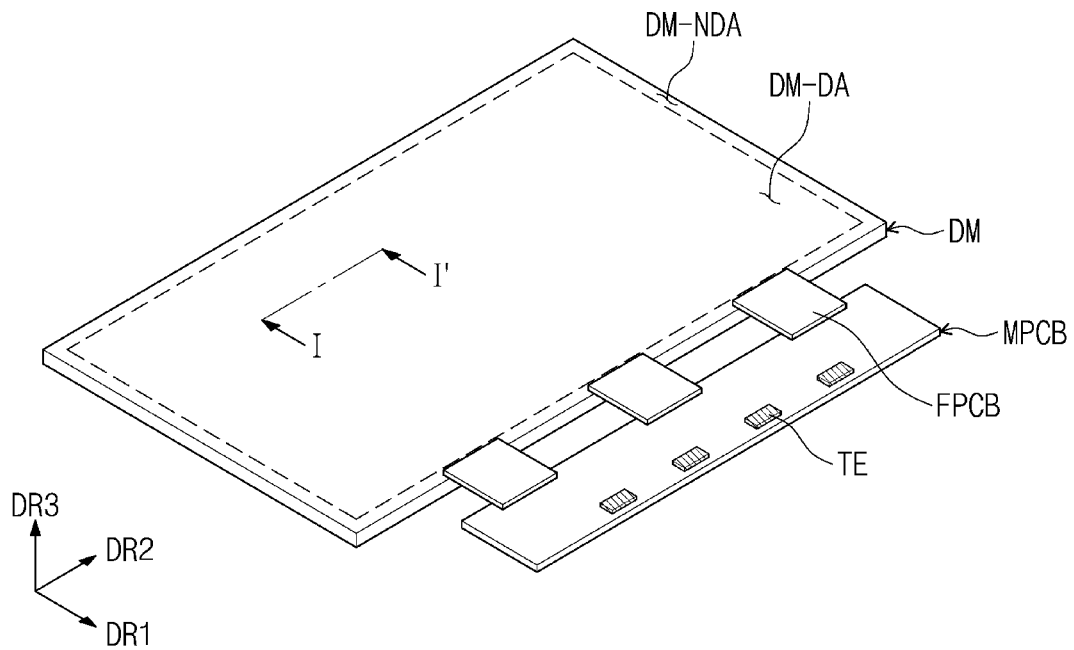
FIGS. 2A and 2B are each a perspective view of some components included in a display device according to an embodiment of the disclosure.
Figure 2B:
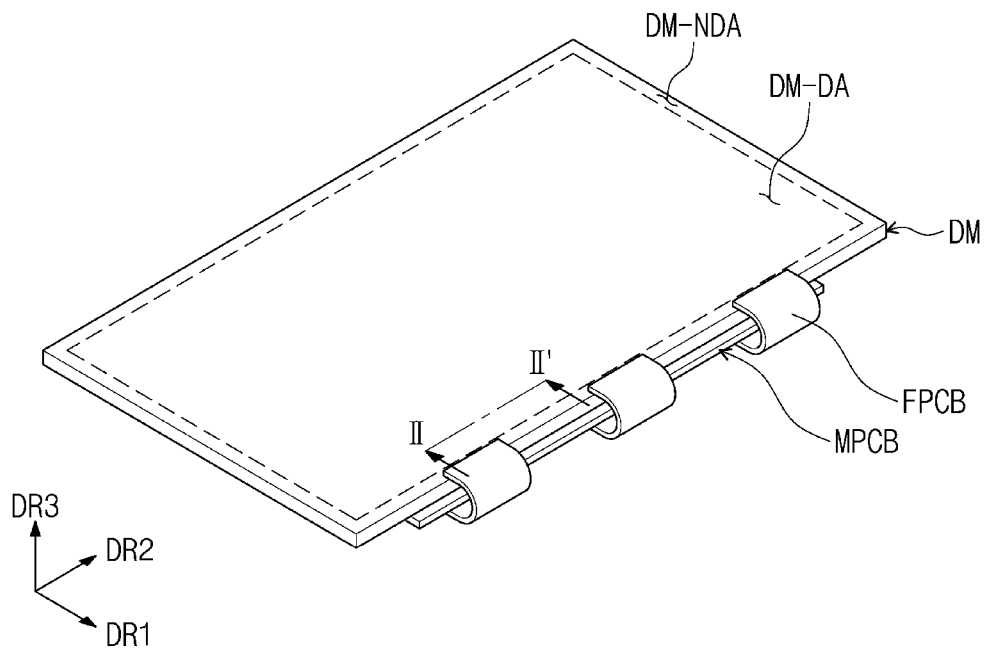

FIGS. 2A and 2B are each a schematic perspective view of some components included in a display device according to an embodiment of the disclosure. FIGS. 2A and 2B illustrate that the display module DM and the circuit board MPCB are electrically connected to each other. FIG. 2A illustrates a state before a connection circuit board FPCB connecting the display module DM and the circuit board MPCB is bent, and FIG. 2B illustrates a state in which the connection circuit board FPCB connecting the display module DM and the circuit board MPCB is bent.

At least one circuit element TE may be mounted on the circuit board MPCB. The circuit element TE receives image data and a control signal from an external graphic controller (not shown). The circuit element TE may provide a control signal and a driving signal to the display module DM. Multiple circuit elements TE may be provided. FIG. 2A illustrates that four circuit elements TE are mounted on the circuit board MPCB by way of example, but the embodiment of the disclosure is not limited thereto, and two or three circuit elements TE or five or more circuit elements TE may be mounted on the circuit board MPCB.

The connection circuit board FPCB may be electrically connected to the display module DM and the circuit board MPCB. The connection circuit board FPCB may transmit a signal from the circuit board MPCB to the driving circuit and may transmit a signal from the driving circuit to the display module DM. In this embodiment, the driving circuit may be a data driving circuit. The driving circuit may be mounted on the connection circuit board FPCB. However, the embodiment of the disclosure is not limited thereto, and the driving circuit may be mounted on the circuit board MPCB or the display module DM.

In an embodiment of the disclosure, the connection circuit board FPCB may transmit a signal from the circuit element TE to the display module DM. The connection circuit board FPCB may be electrically connected to each of the display module DM and the circuit board MPCB by a conductive adhesive member. The conductive adhesive member may include an anisotropic conductive film.

The connection circuit board FPCB may include a flexible material. The connection circuit board FPCB may be bent at a curvature (e.g., a predetermined or selected curvature), and accordingly, the circuit board MPCB may be disposed under the display module DM. In case that the display module DM to which the circuit board MPCB is electrically connected is mounted inside the housing HAU (see FIG. 1) of the display device DD (see FIG. 1), the circuit board MPCB may be mounted in a state disposed under the display module DM as shown in FIG. 2B. Hereinafter, a state in which the connection circuit board FPCB is bent as shown in FIG. 2B will be described.

Figure 3:
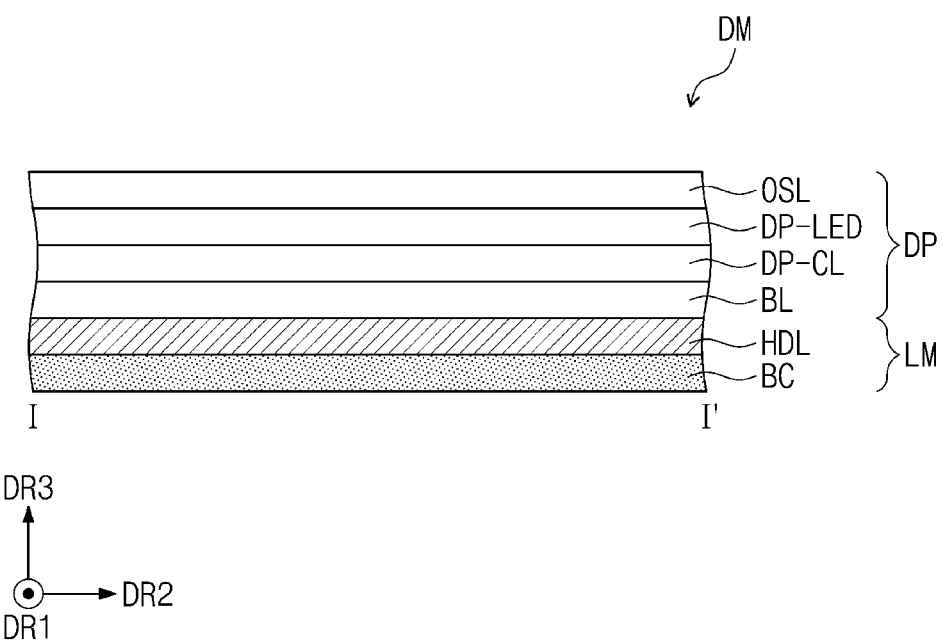
FIG. 3 is a cross-sectional view of a display module according to an embodiment of the disclosure.

FIG. 3 is a schematic cross-sectional view of a display module according to an embodiment of the disclosure. FIG. 3 illustrates a cross-section taken along line I-I' shown in FIG. 2A.

As shown in FIG. 3, the display module DM according to an embodiment of the disclosure may include a display panel DP and a lower member LM. The lower member LM may be disposed under the display panel DP. The lower member LM may be disposed under a base layer BL of the display panel DP.

As shown in FIG. 3, the display panel DP includes a base layer BL, a circuit element layer DP-CL, a display element layer DP-LED, and an optical structure layer OSL.

The base layer BL may include a synthetic resin substrate or a glass substrate. The circuit element layer DP-CL includes at least one insulating layer and a circuit element. The circuit elements include signal lines, pixel driving circuits, and the like. The circuit element layer DP-CL may be formed by a process of forming an insulating layer, a semiconductor layer, and a conductive layer by coating or deposition, and a process of patterning an insulating layer, a semiconductor layer, and a conductive layer by a photolithography process. The display element layer DP-LED includes at least a display element. The optical structure layer OSL may convert the color of light provided from the display element. The optical structure layer OSL includes a light control pattern and a structure for increasing light conversion efficiency. Hereinafter, each component included in the display panel DP will be described in more detail with reference to FIGS. 4A to 4C.

A lower member LM is disposed under the display panel DP, and the lower member LM may include a heat dissipation layer HDL and a bottom chassis (or frame) BC.

The heat dissipation layer HDL may dissipate the heat generated by the display panel DP to the outside. The heat dissipation layer HDL and the display panel DP may have substantially a same shape and may have substantially a same area.

The heat dissipation layer HDL may include a material having relatively high thermal conductivity, such as a tungsten-copper composite material, a molybdenum-copper composite material, or graphite. The heat dissipation layer HDL may have a porous structure. In this embodiment, the heat dissipation layer HDL may include a graphite layer. The thickness of the graphite layer may be, for example, about 1 mm or more and about 20 mm or less.

Although not shown in the drawing, the heat dissipation layer HDL may be coupled to the lower surface of the display panel DP by a separate adhesive layer. The adhesive layer may include, for example, a pressure-sensitive adhesive layer, but is not limited thereto.

Although not shown in the drawing, the heat dissipation layer HDL may further include a protective layer for protecting and sealing the graphite layer. The protective layer is disposed above and below the graphite layer included in the heat dissipation layer HDL, so that it is possible to prevent the particles of the graphite layer from being emitted to the outside to contaminate the display panel DP, etc., and to protect the graphite layer from external impact. In an embodiment, the heat dissipation layer HDL may be omitted. In case that the heat dissipation layer HDL is omitted, the bottom chassis BC may be disposed directly under the base layer BL.

The bottom chassis BC is disposed under the heat dissipation layer HDL to support the heat dissipation layer HDL and the display panel DP disposed on the top. The bottom chassis BC may have a rigidity (e.g., a predetermined or selected rigidity) and may be a component that prevents the shape of the components disposed on the bottom chassis BC from being deformed. The bottom chassis BC may include a metal plate or a plastic plate. For example, the bottom chassis BC may include stainless steel, aluminum, or an alloy thereof. For example, the bottom chassis BC may include SUS304. As another example, the bottom chassis BC may include polyethylene terephthalate (PET) or polyimide (PI). The strength of the bottom chassis BC may be greater than the strength of the display panel DP.

An opening BC-OP (see FIG. 5A) for improving heat dissipation characteristics may be defined in the bottom chassis BC. The opening BC-OP (see FIG. 5A) defined in the bottom chassis BC will be described below.

Figure 4A:
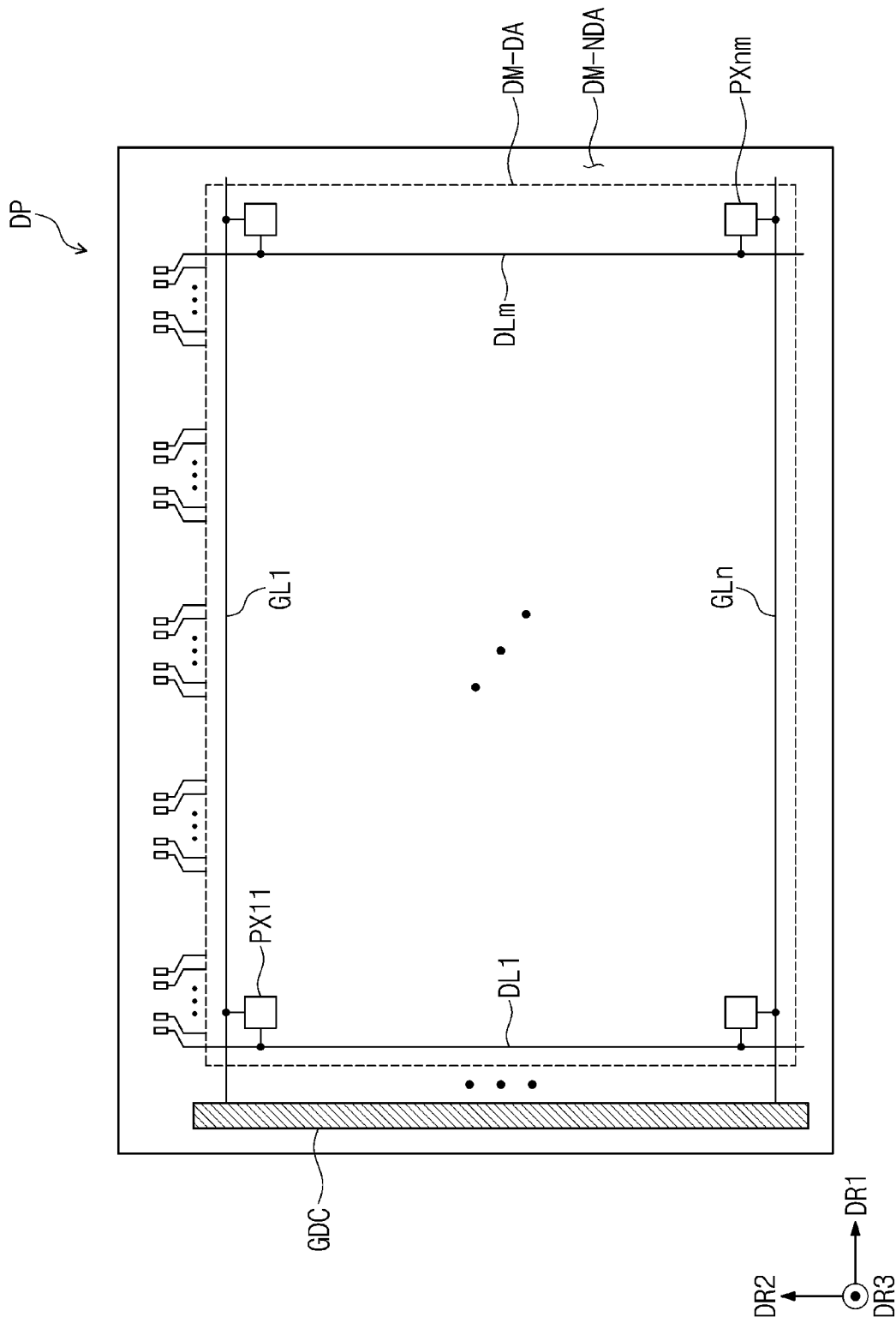
FIG. 4A is a plan view of a display panel according to an embodiment of the disclosure.
Figure 4B:
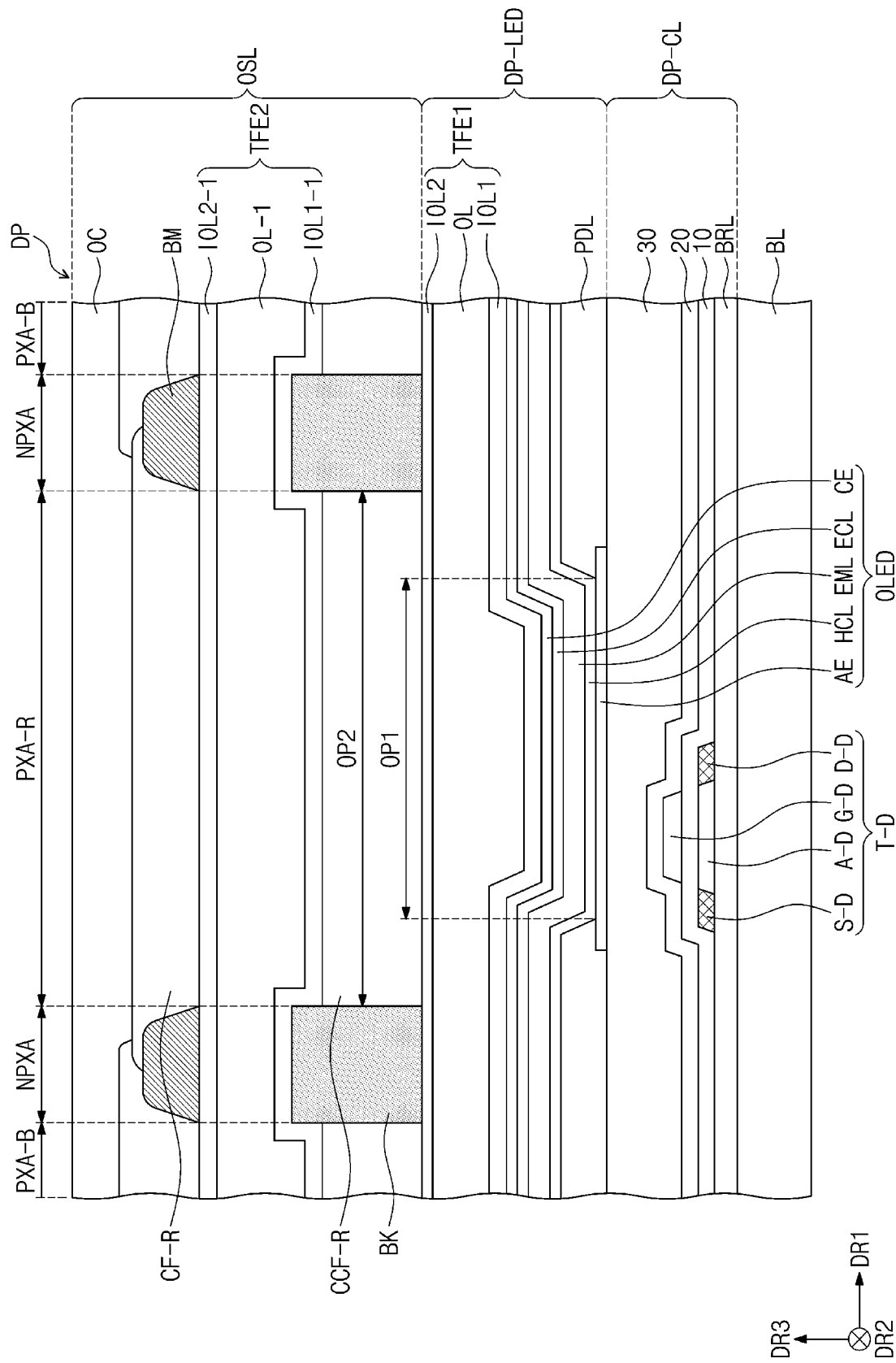
FIG. 4B is a cross-sectional view of a display panel according to an embodiment of the disclosure.
Figure 4C:
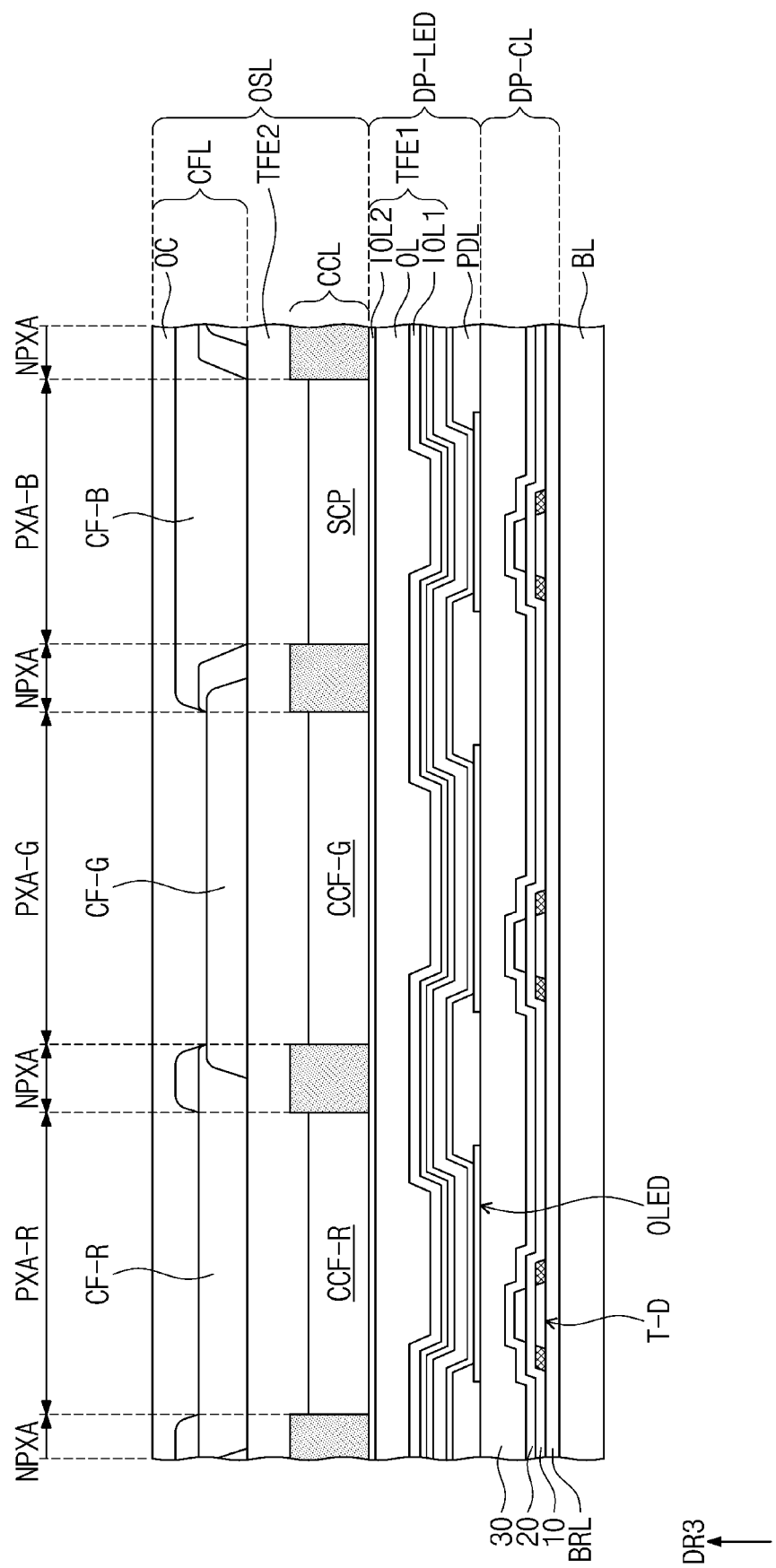
FIG. 4C is a cross-sectional view of a display panel according to an embodiment of the disclosure.

FIG. 4A is a schematic plan view of a display panel according to an embodiment of the disclosure. FIG. 4B is a schematic cross-sectional view of a display panel according to an embodiment of the disclosure. FIG. 4C is a schematic cross-sectional view of a display panel according to an embodiment of the disclosure.

FIG. 4A illustrates a planar arrangement relationship of signal lines GL1 to GLn and DL1 to DLm and pixels PX11 to PXnm in the display panel DP of an embodiment. The signal lines GL1 to GLn and DL1 to DLm may include gate lines GL1 to GLn and data lines DL1 to DLm.

Each of the pixels PX11 to PXnm is electrically connected to a corresponding gate line among the gate lines GL1 to GLn and a corresponding data line among the data lines DL1 to DLm. Each of the pixels PX11 to PXnm may include a pixel driving circuit and a display element. More types of signal lines may be provided on the display panel DP according to the configuration of the pixel driving circuit of the pixels PX11 to PXnm.

Although FIG. 4A illustrates, as an example, the pixels PX11 to PXnm in a matrix form (where n and m are natural numbers), the embodiment of the disclosure is not limited thereto. The pixels PX11 to PXnm may be arranged in a Pentile® pixel configuration. For example, points at which the pixels PX11 to PXnm are disposed may correspond to vertices of a diamond. A gate driving circuit GDC may be integrated on the display panel DP by an oxide silicon gate driver circuit (OSG) or amorphous silicon gate driver circuit (ASG) process.

Referring to FIG. 4B, the circuit element layer DP-CL may include a transistor T-D as a circuit element. As the driving circuit of the pixels PX11 to PXnm (see FIG. 4A) is designed, the configuration of the circuit element layer DP-CL may be different, and FIG. 4B illustrates, as an example, a transistor T-D. FIG. 4B also illustrates, as an example, the arrangement relationship of an active A-D, a source S-D, a drain D-D, and a gate G-D constituting the transistor T-D. The active A-D, the source S-D, and the drain D-D may be areas divided according to the doping concentration or conductivity of the semiconductor pattern.

The circuit element layer DP-CL may include a lower buffer layer BRL, a first insulating layer 10, a second insulating layer 20, and a third insulating layer 30 disposed on the base layer BL. For example, the lower buffer layer BRL, the first insulating layer 10, and the second insulating layer 20 may be inorganic layers, and the third insulating layer 30 may be an organic layer.

The display element layer DP-LED may include a light emitting element OLED as a display element. The light emitting element OLED may generate the above-described source light. The light emitting element OLED includes a first electrode AE, a second electrode CE, and a light emitting layer EML disposed therebetween. In this embodiment, the display element layer DP-LED may include an organic light emitting diode as a light emitting element. In an embodiment of the disclosure, the light emitting element may include a quantum dot light emitting diode. For example, the light emitting layer EML included in the light emitting element OLED may include an organic light emitting material as a light emitting material, or the light emitting layer EML may include quantum dots as a light emitting material. As another example, the display element layer DP-LED may include a miniature light emitting element as a light emitting element. The miniature light emitting element may include, for example, a micro LED element and/or a nano LED element. The length and width of the miniature light emitting element may be between several hundred nanometers and several hundred micrometers.

The display element layer DP-LED includes a pixel defining film PDL. For example, the pixel defining film PDL may be an organic layer. The light emitting element OLED may be disposed at least partially within an opening defined in the pixel defining film PDL.

The first electrode AE is disposed on the third insulating layer 30. The first electrode AE may be directly or indirectly electrically connected to the transistor T-D, and the connection structure of the first electrode AE and the transistor T-D is not shown in FIG. 4B. A first opening OP1 is defined in the pixel defining film PDL. The first opening OP1 of the pixel defining film PDL exposes at least a portion of the first electrode AE. In this embodiment, the first opening OP1 defines a first pixel area PXA-R.

A hole control layer HCL, the light emitting layer EML, and an electron control layer ECL overlap (e.g., in a plan view) at least the first pixel area PXA-R. The hole control layer HCL, the light emitting layer EML, the electron control layer ECL, and the second electrode CE may be commonly disposed in the first to third pixel areas PXA-R, PXA-G, and PXA-B (see FIG. 4C). Each of the hole control layer HCL, the light emitting layer EML, the electron control layer ECL, and the second electrode CE overlapping the first to third pixel areas PXA-R, PXA-G, and PXA-B may have an integral shape. However, the embodiment of the disclosure is not limited thereto, and at least one of the hole control layer HCL, the light emitting layer EML, or the electron control layer ECL may be formed separately for each of the first to third pixel areas PXA-R, PXA-G, and PXA-B.

The hole control layer HCL may include a hole transport layer and may further include a hole injection layer. The light emitting layer EML may generate blue light that is source light. The blue light may include light having a wavelength of about 410 nm to about 480 nm. The emission spectrum of blue light may have a maximum peak within about 440 nm to about 460 nm. The electron control layer ECL may include an electron transport layer and may further include an electron injection layer.

The display element layer DP-LED may include a first encapsulation layer TFE1 protecting the second electrode CE. The first encapsulation layer TFE1 may include an organic material or an inorganic material. The first encapsulation layer TFE1 may have a multilayer structure in which inorganic layers or organic layers are repeatedly stacked. In this embodiment, the first encapsulation layer TFE1 may include a first encapsulation inorganic layer IOL1, an encapsulation organic layer OL, and a second encapsulation inorganic layer IOL2. The first and second encapsulation inorganic layers IOL1 and IOL2 may protect the light emitting element OLED from external moisture, and the encapsulation organic layer OL may prevent damage to light emitting element OLED (e.g., engraving of the light emitting element OLED) due to foreign substances introduced during the manufacturing process. Although not shown in the drawing, the display panel DP may further include a refractive index control layer on an upper side of the first encapsulation layer TFE1 to improve light output efficiency.

As shown in FIG. 4B, an optical structure layer OSL is disposed on the first encapsulation layer TFE1. The optical structure layer OSL includes a bank BK, a first light control pattern CCF-R, a second encapsulation layer TFE2, a first color filter CF-R, a light blocking pattern BM, and an overcoat layer OC.

The bank BK may include a base resin and an additive. The base resin may be composed of various resin compositions, which may be generally referred to as binders. Additives may include coupling agents and/or photoinitiators. The additive may further include a dispersant.

The bank BK may include a black coloring agent to block light. The bank BK may include a black dye and a black pigment mixed with a base resin. In an embodiment, the black component may include carbon black, a metal such as chromium, or an oxide thereof.

The bank BK includes a second opening OP2 corresponding to the first opening OP1. In a plan view, the second opening OP2 overlaps the first opening OP1 and has a larger area than the first opening OP1.

The first light control pattern CCF-R is disposed inside the second opening OP2. The first light control pattern CCF-R may change an optical property of the source light. The first light control pattern CCF-R may include quantum dots for changing the optical properties of the source light.

The first light control pattern CCF-R may include quantum dots that convert source light into light having a different wavelength. In the first light control pattern CCF-R overlapping (e.g., in a plan view) the first pixel area PXA-R (see FIG. 4C), the quantum dots may convert blue light, which is a source light, into red light.

Quantum dots may have a core-shell structure, and the core of the quantum dot may be selected from a group II-VI compound, a group III-VI compound, a group I-III-VI compound, a group III-V compound, a group IV-VI compound, a group IV element, a group IV compound, and combinations thereof.

The group II-VI compound may be selected from the group including (or consisting of) a two-element compound selected from the group including CdSe, CdTe, CdS, ZnS, ZnSe, ZnTe, ZnO, HgS, HgSe, HgTe, MgSe, MgS, and mixtures thereof, a three-element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a four-element compound selected from the group including HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-VI compound may include a two-element compound such as $In_2S_3$, $In_2Se_3$, or the like, a three-element compound such as $InGaS_3$, $InGaSe_3$, or the like, or any combination thereof.

The I-III-VI group compound may be selected from a three-element compound selected from the group including AgInS, $AgInS_2$, CuInS, $CuInS_2$, $AgGaS_2$, $CuGaS_2$ $CuGaO_2$, $AgGaO_2$, $AgAlO_2$, and mixtures thereof, or a four-element compound such as $AgInGaS_2$ and $CuInGaS_2$.

The group III-V compound may be selected from the group including a two-element compound selected from the group including of GaN, GaP, GaAs, GaSb, AlN, AlP, AlAs, AlSb, InN, InP, InAs, InSb, and mixtures thereof, a three-element compound selected from the group including of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a four-element compound selected from the group including GaAlNP, GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and mixtures thereof. The group III-V compound may further include a group II metal. For example, the group III-II-V compound may include InZnP, InGaZnP, InAlZnP, and the like.

The group IV-VI compound may be selected from the group including of a two-element compound selected from the group including SnS, SnSe, SnTe, PbS, PbSe, PbTe, and mixtures thereof, a three-element compound selected from the group including of SnSeS, SnSeTe, SnSTe, PbSeS, PbSeTe, PbSTe, SnPbS, SnPbSe, SnPbTe, and mixtures thereof, and a four-element compound selected from the group including SnPbSSe, SnPbSeTe, SnPbSTe, and mixtures thereof. The group IV element may be selected from the group including Si, Ge, and mixtures thereof. The group IV compound may be a two-element compound selected from the group including SiC, SiGe, and mixtures thereof.

In this case, the two-element compound, the three-element compound, or the four-element compound may be present in the particle at a uniform concentration, or may be present in a same particle with partially different concentration distributions. In addition, a quantum dot may have a core-shell structure surrounding another quantum dot. In the core-shell structure, the concentration of an element present in the shell may have a concentration gradient that decreases as it approaches the core.

In some embodiments, the quantum dot may have a core-shell structure including a core including the aforementioned nanocrystals and a shell surrounding the core. The shell of the quantum dot may function as a protective layer for maintaining semiconductor properties by preventing chemical modification of the core and/or the role of a charging layer for assigning (or imparting) electrophoretic properties to quantum dots. The shell may be single-layered or multi-layered. Examples of the quantum dot shell may include a metal or non-metal oxide, a semiconductor compound, or a combination thereof.

For example, the oxide of the metal or non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a three-element compound such as $MgAl_2O_4$, $CoFe_2O_4$, $NiFe_2O_4$, and $CoMn_2O_4$, but the embodiment of the disclosure is not limited thereto.

In addition, the semiconductor compound may include, as an example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the embodiment of the disclosure is not limited thereto.

Quantum dots may have a full width of half maximum (FWHM) of the emission wavelength spectrum of about 45 nm or less, preferably about 40 nm or less, more preferably about 30 nm or less, and may improve color purity or color reproducibility in this range. In addition, since light emitted through these quantum dots is emitted in all directions, a wide viewing angle may be improved.

In addition, the shape of the quantum dots is of a type generally used in the field and is not particularly limited, and more specifically, may be a spherical form, a pyramidal form, a multi-arm form, or a form of cubic nanoparticles, nanotubes, nanowires, nanofibers, and nanoplatelet particles.

The quantum dot may control the color of the light emitted according to the particle size, and accordingly, the quantum dot may have various emission colors such as blue, red, and green. In an embodiment, quantum dots included in the first light control pattern CCF-R overlapping the first pixel area PXA-R (see FIG. 4B) may have a red emission color. As the particle size of the quantum dots is smaller, light in a shorter wavelength area may be emitted. For example, the particle size of quantum dots emitting green light, having a same core may be smaller than the particle size of quantum dots emitting red light. In addition, the particle size of quantum dots emitting blue light, having a same core may be smaller than the particle size of quantum dots emitting green light. However, the embodiment is not limited thereto, and even in quantum dots having a same core, the particle size may be adjusted according to the material for forming the shell and the thickness of the shell.

In case that the quantum dots have various emission colors such as blue, red, and green, the quantum dots having different emission colors may have different core materials.

The first light control pattern CCF-R may further include a scatterer. The first light control pattern CCF-R may include quantum dots that convert blue light into red light and a scatterer that scatters light.

The scatterers may be inorganic particles. For example, the scatterer may include at least one of $TiO_2$, ZnO, $Al_2O_3$, $SiO_2$, or hollow silica. The scatterer may include any one of $TiO_2$, ZnO, $Al_2O_3$, $SiO_2$, and hollow silica, or a mixture of two or more materials selected from $TiO_2$, ZnO, $Al_2O_3$, $SiO_2$, and hollow silica.

The first light control pattern CCF-R may include a base resin for dispersing quantum dots and scatterers. The base resin is a medium in which quantum dots and scatterers are dispersed, and may be made of various resin compositions that may be generally referred to as binders. For example, the base resin may be an acrylic resin, a urethane resin, a silicone resin, an epoxy resin, or the like. The base resin may be a transparent resin.

In this embodiment, the first light control pattern CCF-R may be formed by an inkjet process. A liquid composition is provided in the second opening OP2. The composition polymerized by the thermal curing process or the light curing process is reduced in volume after curing.

A step (or height or thickness difference) may be formed between the upper surface of the bank BK and the upper surface of the first light control pattern CCF-R. For example, the upper surface of the bank BK may be defined to be higher than the upper surface of the first light control pattern CCF-R. A height difference between the upper surface of the bank BK and the upper surface of the first light control pattern CCF-R may be, for example, about 2 μm to about 3 μm.

A second encapsulation layer TFE2 at least partially overlapping (e.g., in a plan view) the first light control pattern CCF-R is disposed on the bank BK and the first light control pattern CCF-R. The second encapsulation layer TFE2 may include a first inorganic encapsulation layer IOL1-1, an organic encapsulation layer OL-1, and a second inorganic encapsulation layer IOL2-1. Although FIG. 4B illustrates that the second encapsulation layer TFE2 includes an organic encapsulation layer OL-1 and two inorganic encapsulation layers IOL1-1 and IOL2-1, the embodiment of the disclosure is not limited thereto, and at least one of the two inorganic encapsulation layers IOL1-1 and IOL2-1 may be omitted. In addition, the organic encapsulation layer OL-1 and the inorganic encapsulation layers IOL1-1 and IOL2-1 may be provided in a number greater than that shown in FIG. 4B.

The inorganic encapsulation layers IOL1-1 and IOL2-1 protect the first light control pattern CCF-R from external moisture, and the organic encapsulation layer OL-1 removes steps defined by the bank BK and the first light control pattern CCF-R, and provides a flat base surface to a member to be disposed on the upper side thereof. The inorganic encapsulation layers IOL1-1 and IOL2-1 may include any one or more of silicon oxide, silicon oxynitride, and silicon nitride. The organic encapsulation layer OL-1 may include an organic material, for example, an acrylic organic material.

A first color filter CF-R is disposed on the second encapsulation layer TFE2. The first color filter CF-R transmits light in a specific wavelength range and blocks light outside the corresponding wavelength range. The first color filter CF-R of the first pixel area PXA-R may transmit red light and block green light and blue light.

The first color filter CF-R includes a base resin and a dye and/or pigment dispersed in the base resin. The base resin is a medium in which dyes and/or pigments are dispersed, and may be made of various resin compositions that may be generally referred to as binders.

The first color filter CF-R disposed on the flat surface by removing the step difference by the organic encapsulation layer OL-1 may have a uniform thickness within the first pixel area PXA-R. The light converted from the blue light source light to the red light by the first light control pattern CCF-R may be provided to the outside with uniform luminance within the first pixel area PXA-R.

A light blocking pattern BM may be disposed between the color filters disposed in each pixel. The light blocking pattern BM may be disposed to overlap a peripheral area NPXA. The material forming the light blocking pattern BM is not particularly limited as long as the material may absorb light. The light blocking pattern BM is a layer having a black color, and in an embodiment, the light blocking pattern BM may include a black coloring agent. The black coloring agent may include a black dye and a black pigment. The black coloring agent may include a metal such as carbon black or chromium, or an oxide thereof. As another example, the light blocking pattern BM may have a form in which different color filters are stacked. The light blocking pattern BM may be a pattern in which two or more color filters absorbing light of different wavelengths are stacked to block light.

An overcoat layer OC is disposed on the first color filter CF-R. The overcoat layer OC may be an organic layer that protects the first color filter CF-R. The overcoat layer OC may include a photo-curable organic material or a heat-curable organic material. However, the embodiment of the disclosure is not limited thereto, and the overcoat layer OC may include an inorganic material.

The overcoat layer OC may cover (or overlap, e.g., in a plan view) the first color filter CF-R and planarize an upper surface of the first color filter CF-R. In an embodiment, a protective glass substrate may be further disposed on the overcoat layer OC, and an adhesive layer may be disposed between the overcoat layer OC and the glass substrate.

Referring to FIG. 4C, the display element layer DP-LED may include a light emitting element OLED as a display element. The light emitting element OLED may generate the above-described source light and may include the light emitting layer EML (see FIG. 4B) disposed to generally overlap the first pixel area PXA-R, the second pixel area PXA-G, and the third pixel area PXA-B. The light emitting element OLED may overlap at least each of the first pixel area PXA-R, the second pixel area PXA-G, and the third pixel area PXA-B.

A light control layer CCL includes the bank BK and light control patterns CCF-R, CCF-G, and SCP disposed in the second opening OP2 (see FIG. 4B) defined in the bank BK. The light control patterns CCF-R, CCF-G, and SCP may include the first light control pattern CCF-R overlapping the first pixel area PXA-R, a second light control pattern CCF-G overlapping the second pixel area PXA-G, and a third light control pattern SCP overlapping the third pixel area PXA-B. The third light control pattern SCP may be referred to as a transmission pattern.

The light control patterns CCF-R, CCF-G, and SCP are arranged in the second opening OP2 (see FIG. 4B) defined in the bank BK, and at least some of the light control patterns CCF-R, CCF-G, and SCP may change the optical properties of the source light.

In an embodiment, the first light control pattern CCF-R may convert blue light, which is the source light, into red light. The second light control pattern CCF-G may convert blue light, which is the source light, into green light. The transmission pattern SCP may transmit blue light, which is the source light. In the specification, blue light may include light having a wavelength of about 410 nm to about 480 nm, red light may include light having a wavelength of about 620 nm to about 750 nm, and green light may include light having a wavelength of about 500 nm to about 570 nm.

The first light control pattern CCF-R and the second light control pattern CCF-G may include the above-mentioned quantum dots and scatterers, and the transmission pattern SCP may include only the scatterers without having the quantum dots. The quantum dots included in the first light control pattern CCF-R may be particles that convert blue light, which is the source light, into red light, and the quantum dots included in the second light control pattern CCF-G may be particles that convert blue light, which is the source light, into green light.

A second encapsulation layer TFE2 is disposed on the bank BK and the light control patterns CCF-R, CCF-G, and SCP. The second encapsulation layer TFE2 may include the organic encapsulation layer and the inorganic encapsulation layer described above.

A color filter layer CFL is disposed on the second encapsulation layer TFE2. The color filter layer CFL may include color filters CF-R, CF-G, and CF-B, for example, first to third color filters CF-R, CF-G, and CF-B, and an overcoat layer OC covering the color filters CF-R, CF-G, and CF-B. Each of the color filters CF-R, CF-G, and CF-B transmits light in a specific wavelength range and blocks light outside the corresponding wavelength range. The first color filter CF-R overlapping the first pixel area PXA-R may transmit red light and block green light and blue light. The second color filter CF-G overlapping the second pixel area PXA-G may transmit the green light and block the red light and the blue light. The third color filter CF-B overlapping the third pixel area PXA-B may transmit blue light and block green light and red light. The color filters CF-R, CF-G, and CF-B include a base resin and a dye and/or pigment dispersed in the base resin. The base resin is a medium in which dyes and/or pigments are dispersed, and may be made of various resin compositions that may be generally referred to as binders.

The overcoat layer OC may be an organic layer that protects the color filters CF-R, CF-G, and CF-B. The overcoat layer OC may include a photo-curable organic material or a heat-curable organic material. However, the embodiment of the disclosure is not limited thereto, and the overcoat layer OC may include an inorganic material.

Figure 5A:
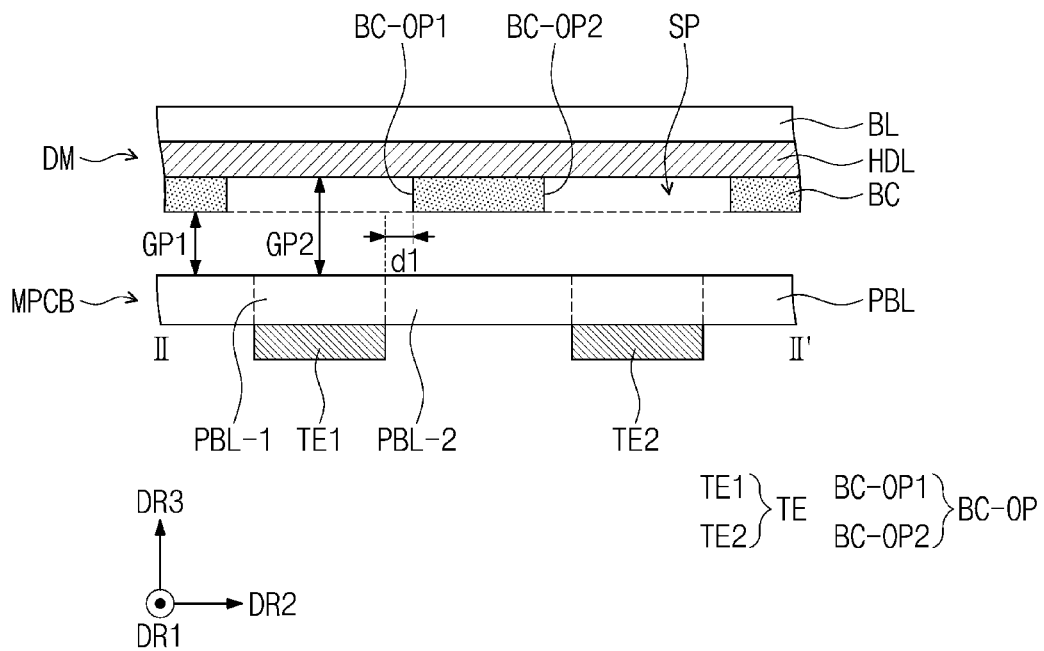
FIG. 5A is a cross-sectional view illustrating a partial configuration of a display device according to an embodiment of the disclosure.
Figure 5B:
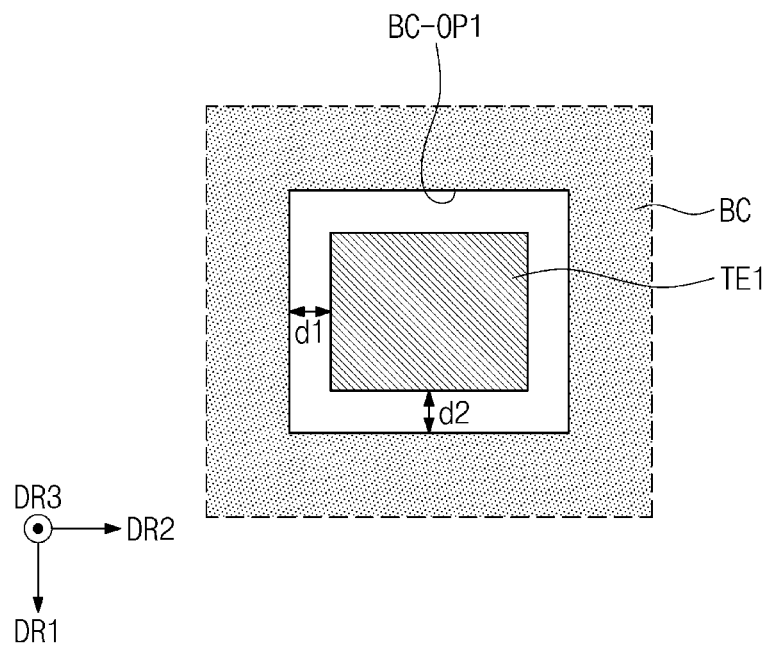
FIG. 5B is a plan view schematically illustrating a partial configuration of a display device according to an embodiment of the disclosure.

FIG. 5A is a schematic cross-sectional view illustrating a partial configuration of a display device according to an embodiment of the disclosure. FIG. 5B is a plan view schematically illustrating some configurations of a display device according to an embodiment of the disclosure. FIG. 5A illustrates a cross-section taken along line II-II' shown in FIG. 2B, and illustrates only the base layer BL, the heat dissipation layer HDL, and the bottom chassis BC among the components included in the display module DM shown in FIG. 3, and components disposed thereon are omitted and not shown. FIG. 5B illustrates a planar arrangement relationship of the bottom chassis BC and the circuit element TE shown in FIG. 5A.

Referring to FIGS. 5A and 5B, the display module DM of an embodiment may include a heat dissipation layer HDL disposed under the base layer BL of the display panel DP (see FIG. 3), and a bottom chassis BC disposed under the heat dissipation layer HDL. An opening BC-OP may be defined in the bottom chassis BC.

As described above, as the connection circuit board FPCB (see FIG. 2B) is bent, the circuit board MPCB is disposed under the display module DM. The circuit board MPCB may include a circuit element TE and a circuit base layer PBL on which the circuit element TE is mounted. The circuit base layer PBL may include an upper surface adjacent to the display module DM and a lower surface spaced apart from the display module DM, and the circuit element TE may be disposed on the lower surface of the circuit base layer PBL. The circuit element TE may be spaced apart from the display module DM with the circuit base layer PBL interposed therebetween.

The opening BC-OP defined in the bottom chassis BC overlaps the circuit element TE in a plan view. In the bottom chassis BC, the opening BC-OP may be provided with a width greater than the width of the circuit element TE in a plan view. The opening BC-OP may be formed to completely overlap the circuit element TE in a plan view. Since the opening BC-OP is wider in a plan view than the circuit element TE, a side of the bottom chassis BC defining the opening BC-OP may be disposed further outward than a side of the circuit element TE. In an embodiment, a first distance d1 between a side of the bottom chassis BC and a side of the circuit element TE defining the opening BC-OP may be about 5 mm or more and about 20 mm or less. The first distance d1 may be, for example, about 5 mm or more and about 10 mm or less.

As the opening BC-OP is provided in the bottom chassis BC, an internal space SP may be defined in the opening BC-OP. In addition, the lower surface of the heat dissipation layer HDL may be exposed to the outside by the opening BC-OP. In case that the heat dissipation layer HDL is omitted, the lower surface of the base layer BL may be exposed by the opening BC-OP.

As the opening BC-OP is provided in the bottom chassis BC, distances between the circuit board MPCB and a portion of the display module DM having an opening BC-OP, and a portion thereof not having an opening BC-OP are different.

In the circuit base layer PBL included in the circuit board MPCB, a portion where the circuit element TE is disposed may be referred to as a circuit portion PBL-1, and a portion where the circuit element TE is not disposed may be referred to as a peripheral portion PBL-2. In an embodiment, a portion of the peripheral portion PBL-2 overlaps a portion where the opening BC-OP is not provided, and a distance from the upper surface of the peripheral portion PBL-2 to the display module DM may be referred to as a first gap GP1. The circuit portion PBL-1 may overlap the opening BC-OP in a plan view, and the distance from the upper surface of the circuit portion PBL-1 to the display module DM may be a second gap GP2.

The first gap GP1 may be greater than or equal to about 0.5 mm and less than or equal to about 1 mm. The first gap GP1 may be the minimum distance between the upper surface of the circuit base layer PBL and the lower surface of the bottom chassis BC. The first gap GP1 may be referred to as a gap between the display module DM and the circuit board MPCB.

The second gap GP2 has a larger value than the first gap GP1. The difference between the second gap GP2 and the first gap GP1 may be substantially the same as the thickness of the bottom chassis BC. The second gap GP2 may be the minimum distance between the upper surface of the circuit base layer PBL and the lower surface of the heat dissipation layer HDL.

The circuit element TE may include sub-circuit elements. The circuit element TE may include a first sub-circuit element TE1 and a second sub-circuit element TE2 spaced apart from the first sub-circuit element TE1.

The bottom chassis BC may be provided with an opening BC-OP corresponding to each of sub-circuit elements. The opening BC-OP defined in the bottom chassis BC may include a first opening BC-OP1 overlapping the first sub-circuit element TE1, and a second opening BC-OP2 overlapping the second sub-circuit element TE2. The first opening BC-OP1 may have a greater width than the first sub-circuit element TE1 in a plan view. The second opening BC-OP2 may have a greater width than the second sub-circuit element TE2 in a plan view. An internal space SP is defined inside each of the first opening BC-OP1 and the second opening BC-OP2, and the lower surface of the heat dissipation layer HDL may be exposed by each of the first opening BC-OP1 and the second opening BC-OP2.

Referring to FIG. 5B, in a plan view, the first opening BC-OP1 has a larger area than the first sub-circuit element TE1, and the first sub-circuit element TE1 may be disposed to be surrounded by an edge in a plan view by the first opening BC-OP1. For example, the first sub-circuit element TE1 may entirely overlap the first opening BC-OP1 in a plan view.

In an embodiment, each of the opening BC-OP and the circuit element TE may have a rectangular shape extending in each of the first direction DR1 and the second direction DR2. The opening BC-OP may have a greater width than the circuit element TE in each of the first direction DR1 and the second direction DR2.

In an embodiment, each distance between the side surfaces of the bottom chassis BC defining the first opening BC-OP1 and the side surfaces of the first sub-circuit element TE1 may be about 5 mm or more and about 20 mm or less. For example, the distance d1 between the side surfaces of the bottom chassis BC and the side surfaces of the first sub-circuit element TE1 spaced apart in the second direction DR2 may be about 5 mm or more and about 20 mm or less. In addition, a distance d2 between the side surfaces of the bottom chassis BC and the side surfaces of the first sub-circuit element TE1 spaced apart in the first direction DR1 may be about 5 mm or more and about 20 mm or less.

FIG. 5B illustrates, as an example, the first opening BC-OP1 and the first sub-circuit element TE1, and the same description may be applied to the arrangement relationship of the second opening BC-OP2 and the second sub-circuit element TE2.

In the display device according to an embodiment, an opening BC-OP is provided in the bottom chassis BC included in the display module DM, and the opening BC-OP is defined to overlap the circuit element TE of the circuit board MPCB in a plan view. Accordingly, heat generated in case that the circuit element TE operates may be effectively blocked from being transferred to the display panel, and thus the lifespan and display efficiency of the display panel may be improved.

Unlike the display device of an embodiment, in case that the opening overlapping the circuit element is not provided in the bottom chassis, the heat generated from the circuit element may be transferred to the display panel disposed on the upper part of the display module, and accordingly, deterioration may occur in the portion of the display panel overlapping the circuit element, and thus the lifespan and display efficiency of the portion may be reduced. In particular, in a thin display device with a small gap between the display module and the circuit board, the effect of heat generated from the circuit element on the display panel may increase.

In the display device according to an embodiment, the internal space SP is provided in the opening BC-OP provided in the bottom chassis BC, and conductive thermal resistance increases through the air layer in the internal space SP, so that heat generated in case that the circuit element TE operates may be prevented from being transferred to the display panel. Therefore, in the display device of an embodiment, deterioration of the display panel may be prevented, and the lifespan and display efficiency of the display panel may be improved.

Figure 6A:
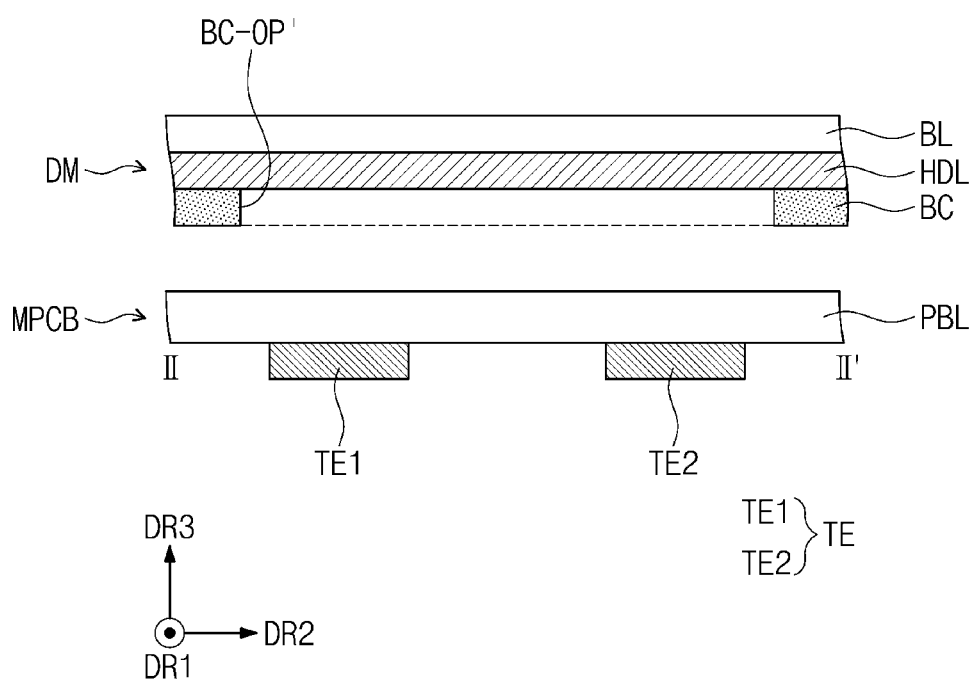
FIG. 6A is a cross-sectional view illustrating a partial configuration of a display device according to an embodiment of the disclosure.

FIG. 6A is a schematic cross-sectional view illustrating a partial configuration of a display device according to an embodiment of the disclosure. FIG. 6B is a plan view schematically illustrating some configurations of a display device according to an embodiment of the disclosure. FIG. 6A illustrates a cross-section taken along line II-II' shown in FIG. 2B, and illustrates only the base layer BL, the heat dissipation layer HDL, and the bottom chassis BC among the components included in the display module DM shown in FIG. 3, and components disposed on the upper part are omitted and not shown. FIG. 6B illustrates a planar arrangement relationship of the bottom chassis BC and the circuit element TE shown in FIG. 6A. Hereinafter, in describing the display device of an embodiment with reference to FIGS. 6A and 6B, components already described with reference to FIGS. 5A and 5B are given the same reference numerals, and detailed descriptions thereof will be omitted.

Referring to FIGS. 6A and 6B, an opening BC-OP' may be defined in the bottom chassis BC in the display module DM of an embodiment. The opening BC-OP' overlaps the circuit element TE in a plan view. The opening BC-OP' may be provided to overlap in a plan view circuit elements TE. As shown in FIGS. 6A and 6B, the opening BC-OP' may be provided to overlap each of the first sub-circuit element TE1 and the second sub-circuit element TE2. FIGS. 6A and 6B illustrate, as an example, that the opening BC-OP' is provided to overlap the two sub-circuit elements TE1 and TE2, but the embodiment of the disclosure is not limited thereto, and the opening BC-OP' may be defined to overlap a larger number of circuit elements. For example, in case that four circuit elements are mounted on the circuit board MPCB as shown in FIG. 2A, the opening BC-OP' may be defined to overlap all four circuit elements.

In a plan view, the opening BC-OP' may have an area greater than a total area of a portion where the first sub-circuit element TE1 and the second sub-circuit element TE2 are disposed. The opening BC-OP' may have a width as large as a first distance d1' from one end (or first end) of the first sub-circuit element TE1 in the second direction DR2, and may have a width as large as a second distance d2' from one end of the first sub-circuit element TE1 in the first direction DR1. The opening BC-OP' may have a width as large as a third distance d3 from one end of the second sub-circuit element TE2 in the second direction DR2, and may have a width as large as a fourth distance d4 from one end of the second sub-circuit element TE2 in the first direction DR1. The opening BC-OP' may overlap the first sub-circuit element TE1 and the second sub-circuit element TE2 between the first sub-circuit element TE1 and the second sub-circuit element TE2, and accordingly, the bottom chassis BC may not overlap the first sub-circuit element TE1 and the second sub-circuit element TE2 between the first sub-circuit element TE1 and the second sub-circuit element TE2.

Each of the first distance d1', the second distance d2', the third distance d3, and the fourth distance d4 may be about 5 mm or more and about 20 mm or less. Each of the first distance d1', the second distance d2', the third distance d3, and the fourth distance d4 may be, for example, about 5 mm or more and about 10 mm or less.

In an embodiment, in case that the area of the circuit base layer PBL included in the circuit board MPCB in a plan view is about 1, the area of the opening BC-OP' may be about 0.8 or more. In case that the area of the circuit base layer PBL in a plan view is about 1, the area of the opening BC-OP' may be about 0.8 or more and less than about 1. As the area of the opening BC-OP' is provided to have a large value of about 80% or more of the circuit base layer PBL, the heat dissipation characteristic of the display module DM may be further improved, and accordingly, deterioration of the display panel may be effectively prevented.

Figure 7A:
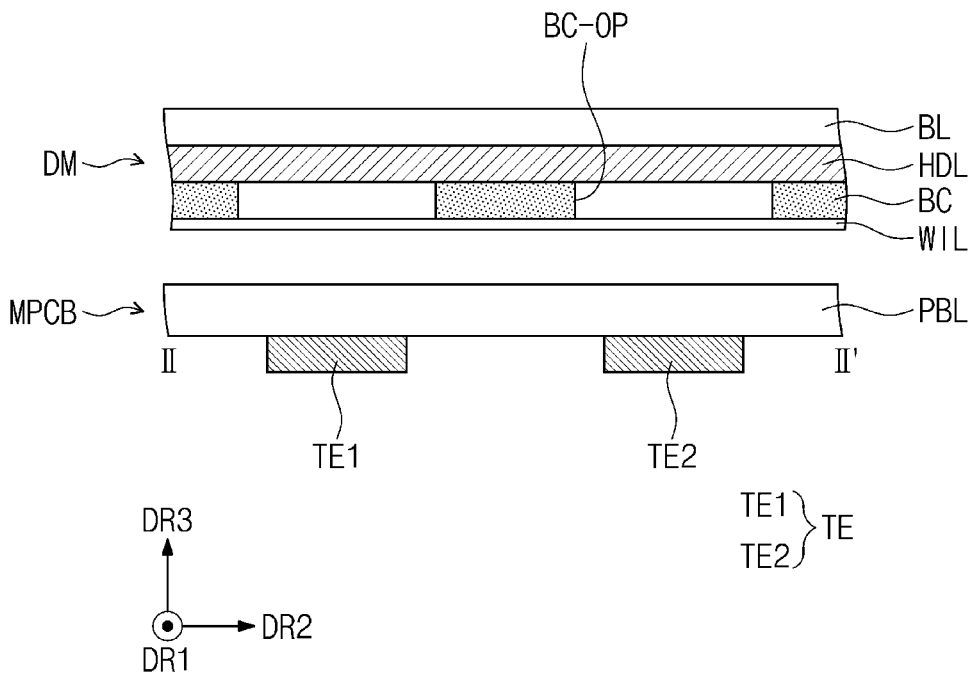
FIGS. 7A to 7C are each a cross-sectional view illustrating a partial configuration of a display device according to an embodiment of the disclosure.
Figure 7B:
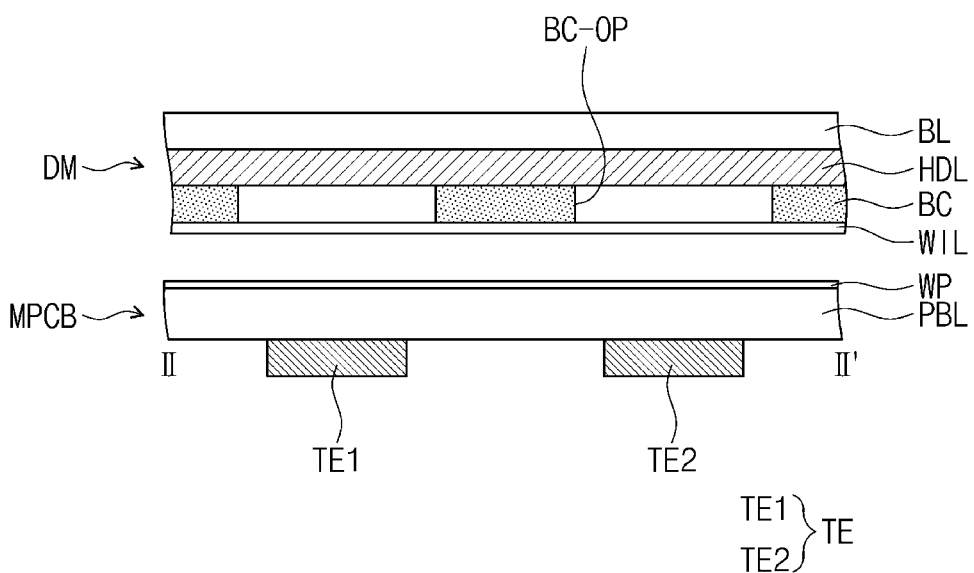
Figure 7C:
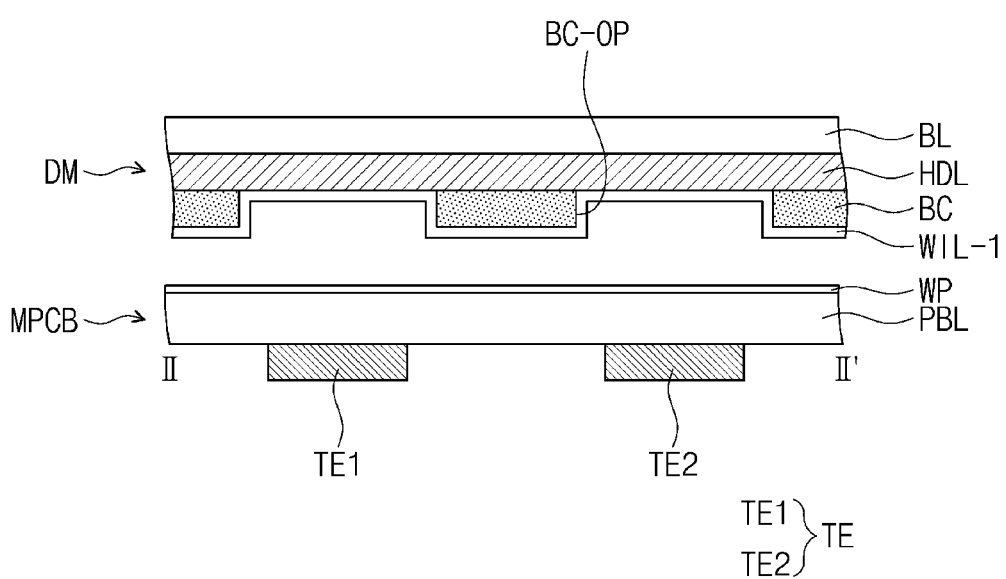

FIGS. 7A to 7C are each a schematic cross-sectional view illustrating a partial configuration of a display device according to an embodiment of the disclosure. Each of FIGS. 7A to 7C illustrates a cross-section taken along line II-II' shown in FIG. 2B, and illustrates only the base layer BL, the heat dissipation layer HDL, and the bottom chassis BC among the components included in the display module DM shown in FIG. 3, and components disposed on the upper part are omitted and not shown. Hereinafter, in describing the display device of an embodiment with reference to FIGS. 7A to 7C, components already described with reference to FIGS. 5A to 6B are given the same reference numerals, and detailed descriptions thereof will be omitted.

The display device of an embodiment may further include a radiation blocking layer disposed between the display module DM and the circuit base layer PBL. The radiation blocking layer may have an emissivity of about 0.3 or less on the surface thereof. The radiation blocking layer may have a color having an emissivity of about 0.3 or less. For example, the radiation blocking layer may have a white color. The radiation blocking layer may be, for example, insulating layers WIL and WIL-1 illustrated in FIGS. 7A to 7C. As another example, the radiation blocking layer may be, for example, the printed layer WP.

Referring to FIG. 7A, the display module DM of an embodiment may further include an insulating layer WIL disposed under the bottom chassis BC. The insulating layer WIL may be attached under the bottom chassis BC in the form of an insulating film.

The insulating layer WIL may be a layer for preventing electromagnetic interference from occurring between the display module DM and the circuit board MPCB arranged at a narrow interval. The insulating layer WIL may include an insulating material. The insulating layer WIL may include an organic insulating material or an inorganic insulating material.

The insulating layer WIL may have an emissivity of about 0.3 or less on the surface thereof. The insulating layer WIL may have a color with an emissivity of about 0.3 or less on the surface thereof. For example, the insulating layer WIL may have a white color. The insulating layer WIL may include an insulating material having a white color. As the insulating layer WIL has a white color, it is possible to minimize the absorption of radiant heat transmitted from the circuit element TE by lowering the emissivity of the insulating layer WIL. Accordingly, heat transferred from the circuit element TE to the upper portion of the display module DM may be minimized, and accordingly, deterioration of the display panel may be effectively prevented.

Referring to FIG. 7B, the circuit board MPCB of an embodiment may further include a printed layer WP printed on the upper surface of the circuit base layer PBL. The printed layer WP may be printed on the upper surface of the circuit base layer PBL and spaced apart from the circuit element TE. The printed layer WP may be disposed between the circuit element TE and the display module DM.

The printed layer WP may have an emissivity of about 0.3 or less on the surface thereof. The printed layer WP may have a color with an emissivity of about 0.3 or less on the surface thereof. For example, the printed layer WP may have a white color. The printed layer WP may be formed by printing a material having a white color on the upper surface of the circuit base layer PBL by inkjet coating, spray coating, silkscreen printing process, or the like. FIG. 7B illustrates, as an example, that the printed layer WP is formed entirely on the upper surface of the circuit base layer PBL, but the embodiment of the disclosure is not limited thereto, and the printed layer WP may be partially formed on the upper surface of the circuit base layer PBL. For example, the printed layer WP may be formed to overlap only the portion where the opening BC-OP is defined.

As the printed layer WP has white color, it is possible to minimize the absorption of radiant heat transmitted from the circuit element TE by lowering the emissivity of the printed layer WP. Accordingly, heat transferred from the circuit element TE to the upper portion of the display module DM may be minimized, and accordingly, deterioration of the display panel may be effectively prevented.

Referring to FIG. 7C, in the display module DM of an embodiment, at least a portion of the insulating layer WIL-1 disposed under the bottom chassis BC may be disposed in the opening BC-OP. The insulating layer WIL-1 may be disposed on the inner side of the opening BC-OP. The insulating layer WIL-1 may be disposed on the lower surface of the heat dissipation layer HDL exposed by the opening BC-OP. The insulating layer WIL-1 may be formed by a coating or deposition process and be disposed within the opening BC-OP. FIG. 7C illustrates, as an example, that the insulating layer WIL-1 is completely disposed inside the opening BC-OP and in a portion of the bottom chassis BC where the opening BC-OP is not defined, but the embodiment of the disclosure is not limited thereto, and the insulating layer WIL-1 may be partially formed. For example, the insulating layer WIL-1 may be disposed only inside the opening BC-OP. The insulating layer WIL-1 may be disposed only on the lower surface of the heat dissipation layer HDL inside the opening BC-OP.

Referring to FIGS. 7A to 7C, the display device of an embodiment includes the printed layer WP or the insulating layers WIL and WIL-1 disposed between the bottom chassis BC of the display module DM and the circuit base layer PBL of the circuit board MPCB, so that it is possible to prevent deterioration of the display panel. For example, the display device of an embodiment includes a low-emissivity layer having a white color between the bottom chassis BC of the display module DM and the circuit base layer PBL of the circuit board MPCB, so that it is possible to prevent the radiant heat transmitted from the circuit element TE from being transmitted to the display panel, thereby preventing the deterioration of the display panel.

Figure 8A:
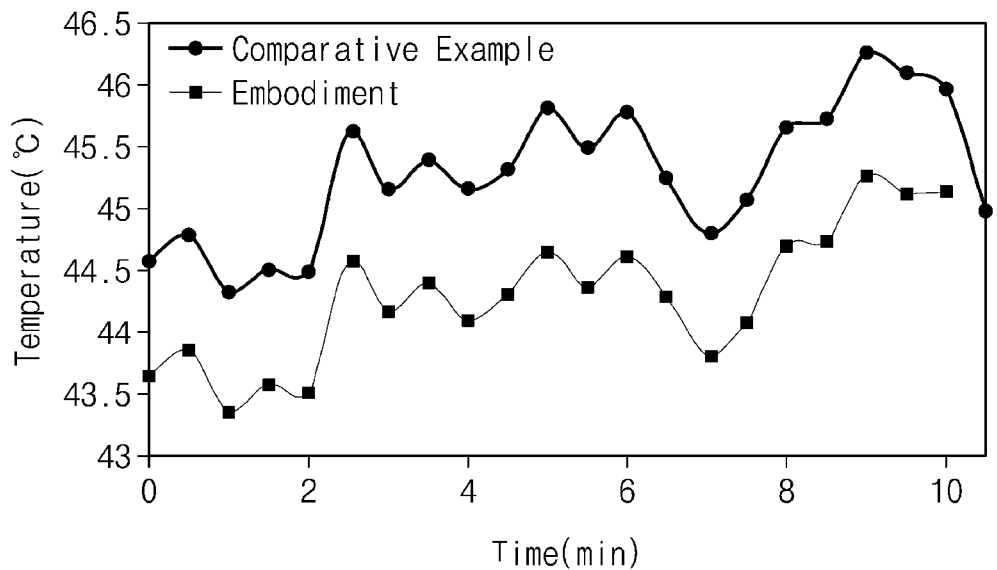
FIGS. 8A and 8B are graphs in which a temperature of a front surface of a display panel is measured according to a time of the display device according to the embodiment of the disclosure and according to a time of the display device according to the comparative example.
Figure 8B:
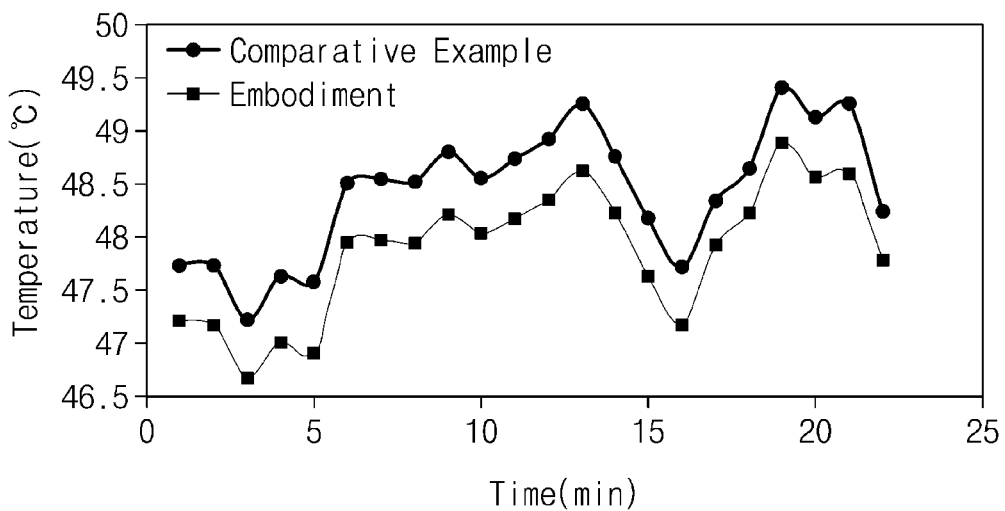

Each of FIGS. 8A and 8B is a graph obtained by measuring a temperature of a front surface of a display panel over time in a display device according to an embodiment of the disclosure and a display device according to a comparative example.

The embodiment of FIG. 8A is a graph illustrating a temperature over time in the display device including the display module DM having the opening BC-OP in the bottom chassis BC shown in FIG. 5A. Unlike the embodiment, the comparative example illustrates a graph of a temperature over time in a display device including a display module in which an opening is not formed in the bottom chassis. FIG. 8A illustrates, as a graph, the trend of changes in temperature of the upper surface of the display panel over time after a same driving pattern is operated on the display devices of the embodiment and the comparative example.

Referring to the graph of FIG. 8A, it was confirmed that the display device of the embodiment shows the temperature of the display panel surface that is lower than that in the comparative example over the entire time, and especially, after curing for 9 minutes, which is the highest temperature point after the display device operates, shows 45.3° C., which is 1° C. lower than the maximum temperature of 46.3° C. of the comparative example. Therefore, it was confirmed that the display device of the embodiment has a structure in which an opening is formed in the bottom chassis, so that the temperature of the front surface of the display panel may be effectively lowered.

The embodiment of FIG. 8B illustrates the temperature graph of the display device over time in which the insulating layer WIL having a white color with an emissivity of about 0.3 or less is disposed under the bottom chassis BC, and the printed layer WP having a white color with an emissivity of about 0.3 or less is disposed on the upper surface of the circuit base layer PBL as shown in FIG. 7B. Unlike the embodiment, the comparative example illustrates a temperature graph over time of the display device in which a printed layer is not formed on the upper surface of a circuit base layer, and an insulating layer having a black color with an emissivity greater than about 0.3 is disposed under a bottom chassis. FIG. 8B illustrates, as a graph, the trend of changes in temperature of the upper surface of the display panel over time after a same driving pattern is operated on the display devices of the embodiment and the comparative example.

Referring to the graph of FIG. 8B, it was confirmed that the display device of the embodiment illustrates the temperature of the of the display panel surface that is lower than that in the comparative example over the entire time, and especially, after 20 minutes after the display device operates, the display device shows 48.9° C., which is 0.5° C. lower than 49.4° C. of the comparative example. Through this, the display device of the embodiment includes a printed layer and/or an insulating layer with low emissivity between the display module and the circuit board, so that it was confirmed that the temperature of the front surface of the display panel may be effectively lowered.

According to the display device of the embodiment of the disclosure, while the distance between the display module and the circuit board is reduced, radiant heat generated from the circuit element mounted on the circuit board is prevented from being transmitted to the display panel, so that deterioration of the display panel may be prevented. Accordingly, the lifespan and display efficiency of the display panel may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a display panel extending in a first direction and a second direction that intersects the first direction;
   a bottom chassis disposed under the display panel in a third direction that is orthogonal to the first direction and the second direction; and
   a circuit board electrically connected to the display panel and disposed under the bottom chassis in the third direction, wherein
   the circuit board comprises:
      a circuit base layer;
      at least one circuit element disposed on a lower surface of the circuit base layer in the third direction; and
      a printed layer disposed on an upper surface of the circuit base layer in the third direction and having an emissivity of about 0.3 or less, and
   the bottom chassis comprises an opening overlapping the at least one circuit element in a plan view.

2. The display device of claim 1, wherein
   an area of the opening is greater than an area of the at least one circuit element in a plan view, and
   the at least one circuit element entirely overlaps the opening in a plan view.

3. The display device of claim 2, wherein a distance between an end of the bottom chassis defining the opening and an end of the at least one circuit element is about 5 mm or more and about 20 mm or less.

4. The display device of claim 2, wherein
   a width in the first direction of the opening is greater than a width in the first direction of the at least one circuit element, and
   a width of the opening in the second direction intersecting the first direction is greater than a width in the second direction of the at least one circuit element.

5. The display device of claim 1, wherein the printed layer has a white color.

6. The display device of claim 1, wherein an area of the opening with respect to an area of the circuit base layer is about 0.8 or more and less than about 1 in a plan view.

7. The display device of claim 1, further comprising:
   an insulating layer disposed under the bottom chassis and having an emissivity of about 0.3 or less.

8. The display device of claim 7, wherein at least a portion of the insulating layer is disposed in the opening.

9. The display device of claim 1, wherein
   the at least one circuit element comprises:
      a first sub-circuit element; and
      a second sub-circuit element spaced apart from the first sub-circuit element, and
   the opening overlaps each of the first sub-circuit element and the second sub-circuit element in a plan view.

10. The display device of claim 9, wherein the opening comprises:
    a first opening overlapping the first sub-circuit element in a plan view; and
    a second opening overlapping the second sub-circuit element and spaced apart from the first opening in a plan view.

11. The display device of claim 1, further comprising:
    a connection circuit board electrically connecting the display panel and the circuit board,
    wherein the connection circuit board is bent with a curvature.

12. The display device of claim 1, further comprising:
    a housing accommodating the display panel and the circuit board; and
    a window disposed on the display panel.

13. The display device of claim 1, wherein the display panel comprises:
    a light emitting element that outputs a source light;
    a light control layer disposed on the light emitting element and including light control patterns; and
    a color filter layer disposed on the light control layer and including color filters.

14. The display device of claim 1, wherein
    the bottom chassis and the circuit board are spaced apart by an interval, and
    the interval is about 0.5 mm or more and about 1 mm or less.

15. The display device of claim 1, further comprising:
    a heat dissipation layer disposed between the display panel and the bottom chassis.

16. A display device comprising:
    a display panel extending in a first direction and a second direction that intersects the first direction;
    a heat dissipation layer disposed under the display panel in a third direction that is orthogonal to the first direction and the second direction;
    a bottom chassis disposed under the heat dissipation layer in the third direction and that includes an opening exposing a lower surface of the heat dissipation layer; and
    a circuit board electrically connected to the display panel and disposed under the bottom chassis in the third direction,
    wherein the circuit board comprises:
       a circuit base layer;
       at least one circuit element disposed on a lower surface of the circuit base layer in the third direction; and
       a printed layer disposed on an upper surface of the circuit base layer in the third direction and having an emissivity of about 0.3 or less.

17. The display device of claim 16, further comprising:
    an insulating layer disposed between the heat dissipation layer and the circuit board and having an emissivity of about 0.3 or less.

18. The display device of claim 16, wherein the printed layer has a white color.

* * * * *